United States Patent
Almagro et al.

(10) Patent No.: US 7,800,207 B2
(45) Date of Patent: Sep. 21, 2010

(54) METHOD FOR CONNECTING A DIE ATTACH PAD TO A LEAD FRAME AND PRODUCT THEREOF

(75) Inventors: Erwin Ian V. Almagro, Dumaguete (PH); Honorio T. Granada, Jr., Cebu (PH); Paul Armand Calo, Lapu-Lapu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 463 days.

(21) Appl. No.: 11/873,725

(22) Filed: Oct. 17, 2007

(65) Prior Publication Data

US 2009/0102031 A1    Apr. 23, 2009

(51) Int. Cl.
*H01L 23/495* (2006.01)
(52) U.S. Cl. .................. 257/676; 257/666; 257/671; 257/E23.037
(58) Field of Classification Search ............. 257/676, 257/666, 671, E23.037, E23.039
See application file for complete search history.

(56) References Cited

U.S. PATENT DOCUMENTS

| | | | |
|---|---|---|---|
| 5,213,748 A * | 5/1993 | Biswas et al. ............... 264/251 |
| 5,859,471 A * | 1/1999 | Kuraishi et al. ............. 257/666 |
| 7,061,080 B2 | 6/2006 | Jeun et al. |
| 7,084,491 B2 * | 8/2006 | Satou et al. ................. 257/676 |
| 7,216,794 B2 | 5/2007 | Lange et al. |
| 7,245,007 B1 * | 7/2007 | Foster ........................ 257/678 |
| 7,323,765 B2 * | 1/2008 | Lam .......................... 257/666 |
| 2004/0262720 A1 * | 12/2004 | Satou et al. ................. 257/676 |
| 2006/0055011 A1 * | 3/2006 | Carney et al. ............... 257/676 |

* cited by examiner

*Primary Examiner*—Nitin Parekh
(74) *Attorney, Agent, or Firm*—Hiscock & Barclay, LLP

(57) ABSTRACT

Disclosed in this specification is a semiconductor package with a die attach pad and a lead frame which are electrically and mechanically connected to one another through a conductive wire ribbon. Such a configuration reduces the package footprint and also permits different styles of die attach pads and lead frames to be interchanged, thus reducing production costs.

14 Claims, 5 Drawing Sheets

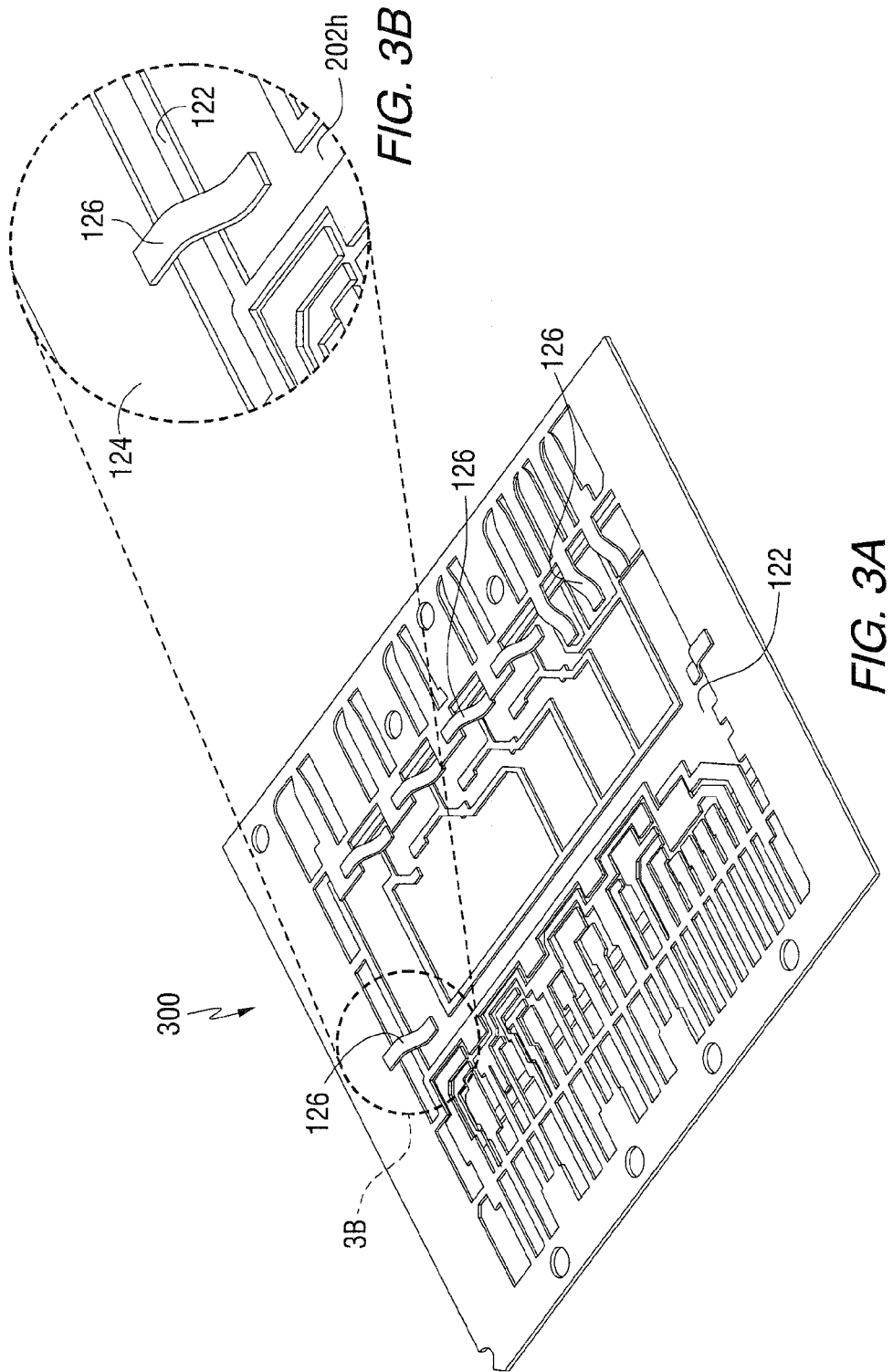

METHOD FOR CONNECTING A DIE ATTACH PAD TO A LEAD FRAME AND PRODUCT THEREOF

FIELD OF THE INVENTION

This invention relates, in one embodiment, to a semiconductor package wherein the die attach pad is electrically and mechanically connected to the lead frame through a conductive wire ribbon. Advantageously, such a configuration reduces the package footprint and also permits multiple die attach pads to be used with a single lead frame, and vice versa, thus reducing production costs. Since the lead and die attach pad are separate, revisions and/or changes of the die attach pad traces can be done independently, thereby lowering production costs.

BACKGROUND OF THE INVENTION

During the fabrication of a semiconductor package, a lead frame is electrically connected to a semiconductor die. The semiconductor die is mounted on a die attach pad (DAP) and electrical connections are made between the leads of the lead frame and the die. A plastic molding then encapsulates the die along with a portion of the metallic lead frame. An external portion of the lead frame remains outside the molding and provides a means for sending electrical signals to the die from outside of the package. The external portion of the lead frame may be connected to a printed circuit board (PCB). Typically the die attach pad is simply a segment of the lead frame, thus the die attach pad is mechanically connected to the lead frame because the two components are unitary. Electrical connections are provided by gold or aluminum wires that are wire-bonded between the die and the leads of the lead frame. In certain "downselt" packages, the die attach pad portion of the lead frame is "stamped" to depress the pad below the plane of the lead frame. Unfortunately, the stamping process necessitates using a package with a large footprint, as the footprint must accommodate the sloping downset that is produced during the stamping process. Even a small die will require a large package. The downset wastes space. An alternate method for fabricating a package uses a separate lead frame and die attach pad. Gold wires provide the electrical connection. The pad and the frame are mechanically attached with high temperature tape or solder. The high temperature used to activate the adhesive often precludes using die attach pads that contain delicate components, as such components may be thermally damaged when the frame is attached.

An alternative method for attaching a die to a lead frame is desired that allows pads with delicate components to be connected to the lead frame.

It is also desired to provide an attachment method that may easily be adapted to connect a variety of die attach pads with a variety of lead frames.

Further, a semiconductor package is desired that minimizes the size of the die footprint.

SUMMARY OF THE INVENTION

The invention comprises, in one form thereof, a semiconductor package that uses a conductive wire ribbon to form a mechanical and electrical connection between the die attach pad and the leads of the lead frame.

An advantage of the present invention is that various die attach pads may be easily paired with selected lead frames. This interchangeability of components helps to reduce production costs and is more efficient than prior art approaches.

A further advantage of the present invention is that downset packages need not have their footprint size unduly increased.

BRIEF DESCRIPTION OF THE DRAWINGS

The present invention is disclosed with reference to the accompanying drawings, wherein:

FIG. 1A and FIG. 1B show profile views of two packages, wherein FIG. 1A is a profile view of a prior art downset package showing a unitary lead frame and die attach pad produced by stamping, and wherein FIG. 1B is a profile view of a semiconductor package of the present invention;

FIGS. 3A and 3B illustrate a perspective view of a die attach pad mechanically and electrically connected to a lead frame by a wire ribbon and FIG. 3B shows a close-up view of such a connection;

Corresponding reference characters indicate corresponding parts throughout the several views. The examples set out herein illustrate several embodiments of the invention but should not be construed as limiting the scope of the invention in any manner.

DETAILED DESCRIPTION OF A PREFERRED EMBODIMENT

Figure 1A:
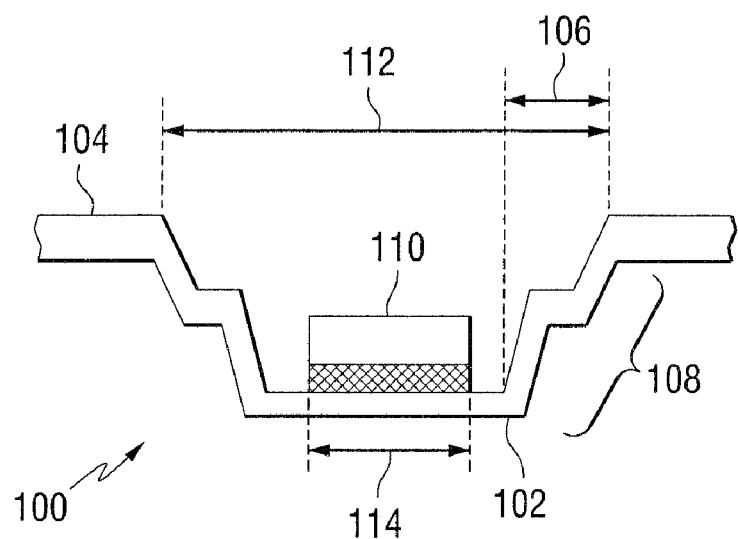

Referring to FIG. 1A, an example of a prior art semiconductor package 100 is shown. Package 100 includes lead frame 104 and die attach pad (DAP) 102, which are unitary. Die 110 is disposed on die attach pad 102. The assembly 100 has a footprint width 112, which is sufficiently wide to accommodate width 114 of die 110 as well as the width 106 of downstep 108. Typically one or more stepwise depressions are used for downset packages, as this improves the stackability of the lead frames—adjacent frames are less likely to become stuck together. The details concerning stepwise downset packages are described in U.S. Pat. No. 6,246,110 to Kinsman et al. (Downset Lead Frame for Semiconductor Packages).

Figure 1B:
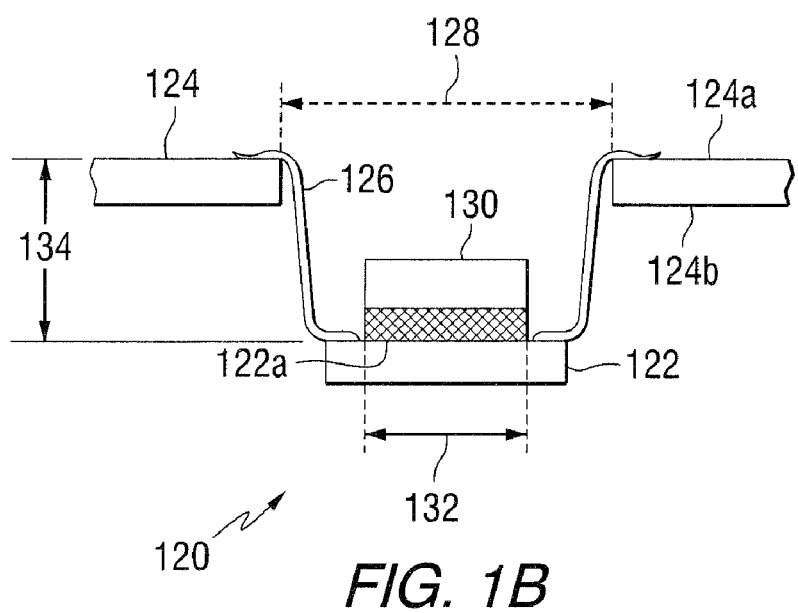

Referring to FIG. 1B, package 120 is comprised of die attach pad (DAP) 122 and lead frame 124 which are mechanically and electrically connected to one another by conductive wire ribbon 126. The wire ribbon connection described herein is more robust than prior art solder connections. In the embodiment depicted in FIG. 1B, die attach pad 122 and lead frame 124 are discrete components (i.e. they are not unitary) which are connected only by conductive wire ribbon 126. Conductive wire ribbon 126 provides both a mechanical connection and a electrical connection between pad 122 and the leads of frame 124. Such a configuration obviates the need to use a stamped downset (see downset 108 of FIG. 1A) and thus permits the package 120 to have a reduced (relative to package 100) footprint width 128 while still accommodating die 130 with width 132. In the embodiment depicted in FIG. 1B, lead frame 124 has an upper surface 124a and a lower surface 124b. Die attach pad 122 has an upper surface 122a. The depth 134 is the distance between the upper surface 124a of the frame 124 and the upper surface 122a of the die attach pad 122. An alternative view of die attach pad 122 is shown in FIG. 2A.

The wire ribbon connection is not limited to downset packages. In some embodiments, the pad is co-planar with respect to the frame, but conductive wire ribbons still form the electrical and mechanical connections between the two discrete components. Such an embodiment is particularly useful when the distance between upper surface 124a and lower surface 124b is thick. As the frame becomes thicker, stamping the lead frame becomes increasingly difficult. The wire ribbon connection provides a method for making the mechanical and electrical connections that obviates the need for stamping.

Another advantage of the package of FIG. 1B is that the DAP 122 and the die 130 may be assembled in advance. Since the DAP 122 is not an initial part of the stamped lead frame, the die 130 can be attached to the DAP before the lead frame is ready. The wire ribbons provide robust and versatile connections. Not only do the wire ribbons hold the DAP in place in relation to the lead frame, but they also provide the electrical connections to circuit traces on the DAP which are themselves connected to terminals of the die.

Figure 2A:
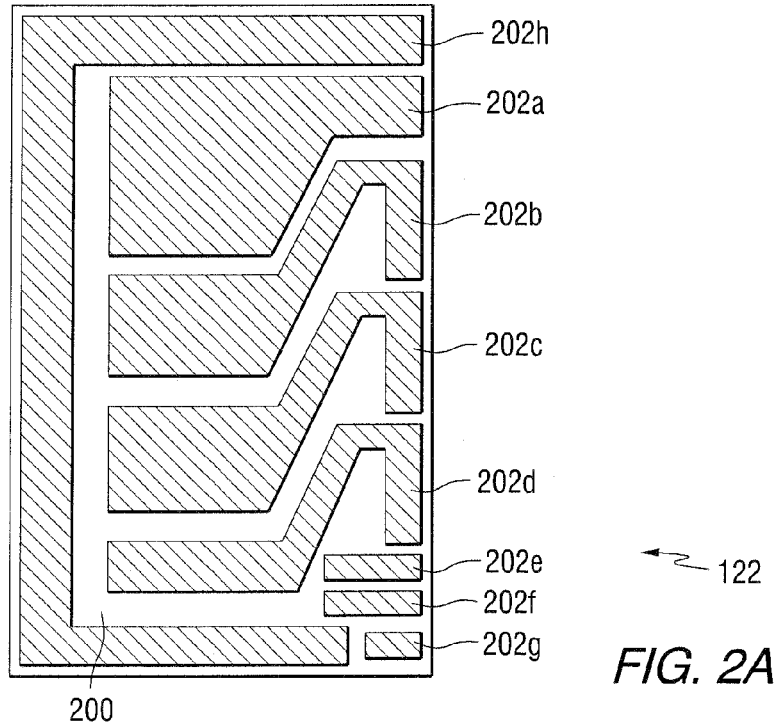
FIG. 2A shows a top view of a die attach pad.
Figure 2B:
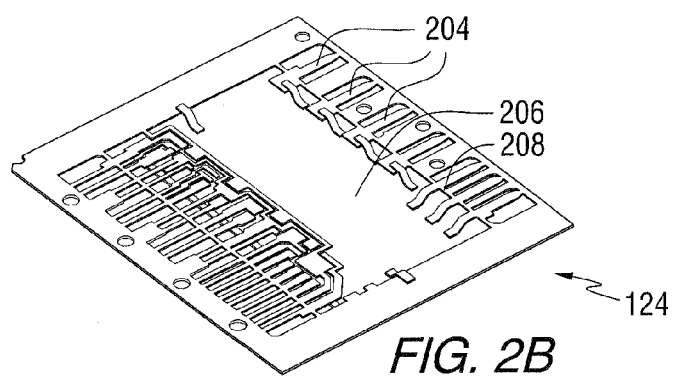
FIG. 2B is a perspective view of a lead frame in FIG. 2B.
Figure 2C:
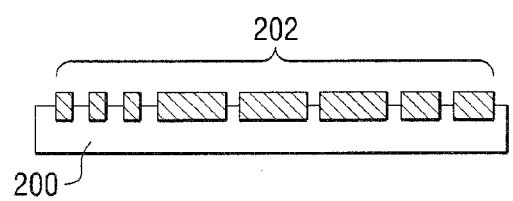
FIG. 2C is a vertical cross section of the die attach pad of FIG. 2A.
Figure 4A:
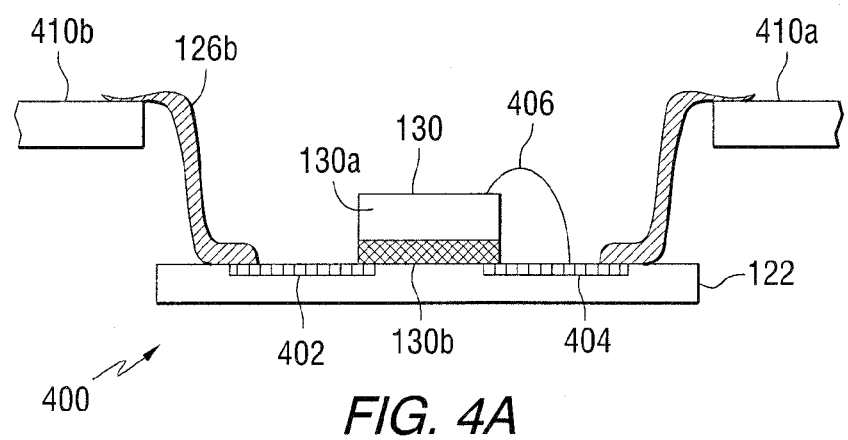
FIGS. 4A and 4B depict various methods for making electrical connections between the die and the traces of the lead frame.

FIGS. 2A, 2B and 2C show the die attach pad 122 (FIG. 2A) and the lead frame 124 (FIG. 2B) before the wire ribbon 126 connection the two components. Referring now to FIG. 2A, die attach pad 122 is comprised of non-conductive planar insulating region 200 and electrically conductive traces 202a-h. FIG. 2C is a vertical cross section of die attach pad 122 that shows another view of the conductive traces 202. When a die (not shown) is placed atop die attach pad 122, electrical connections may be made between terminals on the die and selected conductive traces 202a-h. The details of such electrical connections are shown in FIG. 4A and are discussed in detail elsewhere in this specification. Insulating region 200 is the surface of die attach pad 122. The die attach pad 122, and thus insulating region 200, can made of any suitable insulating material. Examples of such insulating materials include, for example, ceramics such as alumina, aluminum nitride, or beryllium oxide.

Referring now to FIG. 2B, lead frame 124 is shown. The lead frame may be formed from any suitable conductive metal and may be coated with additional materials to improve the physical properties (such as corrosion resistance) of the frame. For example, the lead frame may be formed of copper and plated with a metal or combination of metals such as nickel, palladium, zinc, and the like. Other examples of suitable materials include nickel-iron alloys. Frame 124 has a plurality of leads 204 disposed about open space 206. Tie bars 208 are disposed between each of the leads 204 and will be cut away after final molding. The die attach pad 122 is disposed adjacent to lead frame 124 such that pad 122 is between the leads 204 and below space 206. The pad 122 is maintained parallel to, but not co-planar with (e.g. directly beneath), lead frame 124. In other words, the pad is in a first plane, the lead frame is in a second plane, and the two planes are spaced from one another. Thereafter, the die attach pad 122 is wirebonded to the lead frame 124 with an electrically conductive wire ribbon 126 (see FIG. 1B), thus making package 300 (see FIG. 3A) which has a mechanical and electrical connection between the pad 122 and the frame 124 using the wire ribbon 126.

FIG. 3A and FIG. 3B depict the package 300. Referring to FIG. 3A, die attach pad 122 is shown disposed beneath lead frame 124. The pad 122 is mechanically and electrically connected to frame 124 by conductive wire ribbons 126. FIG. 3B illustrates a close-up view of one such connection.

FIG. 3B shows wire ribbon 126 forming a mechanical and electrical connection between frame 124 and conductive trace 202h. Conductive wire ribbon 126 may be, for example, an aluminum wire ribbon or a copper wire ribbon. U.S. Pat. No. 7,216,794 provides an example of wire ribbon formation. Wire ribbons are distinguished from simple round wires by their greater cross-sectional area relative to a round wire. Typical wire ribbon dimensions are, for example, 80×10 mils, 80×8 mils, 60×8 mils, and 40×4 mils (cross-sectional area-width×thickness). Each of the traces is electrically isolated from one another. For example, as shown in FIG. 2A, trace 202h is electrically isolated from trace 202a-g by insulating region 200. Each of the traces 202a-h may be placed in electrical communication with die attach pad 122 and/or lead frame 124 through a variety of means. Some of these means are depicted in FIGS. 4A and 4B and will be discussed in detail elsewhere in this specification.

The method for forming a semiconductor package that is described herein permits one to select a first type of die attach pad from a plurality of pad types and connect that first type of pad to a given lead frame. Thereafter, the manufacturer can select a second type of pad from the plurality of pads and connect that second type of pad to the same type of lead frame. The opposite permutation is also possible, wherein various lead frames may be connected to a single style of die attach pad. The interchangeability of these components permits manufacturers to more efficiently utilize their inventory.

The wire ribbon connection described in this specification also permits one to use a die attach pad that is preassembled with delicate components and attach such a pad to a lead frame without damaging the components. For example, a die may be wired to the die attach pad with delicate gold or aluminum wires. Such wires form an electrical connection between the die and the traces within the pad. Thereafter, the traces within the pad are mechanically and electrically connected to a lead frame with the aforementioned conductive wire ribbons. Since no high temperatures are used in the process, the delicate wires are not damaged during the connection step. The wires are merely one example of establishing an electrical connection. Other suitable connection methods will be apparent to those skilled in the art.

Figure 4B:
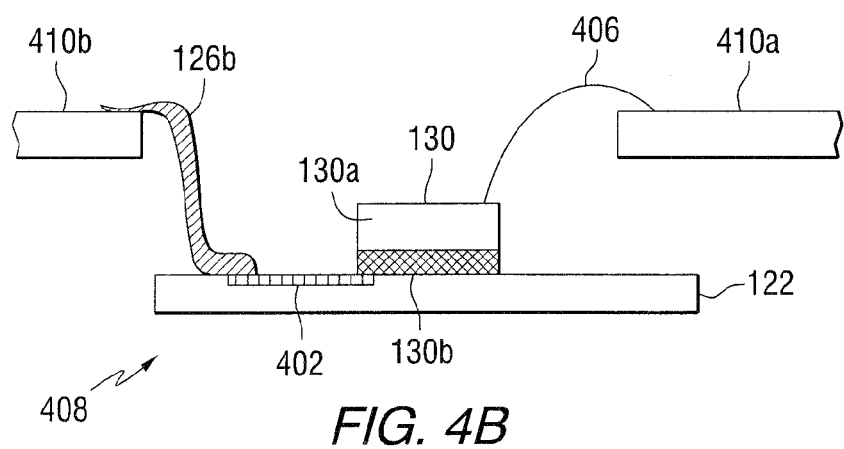

FIGS. 4A and 4B illustrate various means for establishing electrical communication between die 130 and lead frame 410a or 410b. In the embodiment depicted in FIG. 4A, die attach pad 122 is comprised of traces 402 and 404. A terminal (not shown) on the bottom surface 130b of die 130 electrically connects die 130 to trace 402 which, in turn, is in electrical communication with wire ribbon 126b. In this manner, electrical communication is established between die attach pad 122 and frame 410a or 410b. Such a wireless connection may be made when the terminal on the bottom surface 130b is contiguous with the trace 402. One example of a die 130 that makes such a wireless connection is a flip-chip die. Alternatively or additionally, a wired connection 406 may be used to establish an electrical connection. Package 400 contains both a wireless and wired connection. The wire 406 establishes an electrical communication between the top surface 130a of die 130 and trace 404. In one embodiment, a gold or aluminum wire is used. Such wire may be connected using traditional wirebonding techniques. Trace 404, in turn, is mechanically and electrically connected to lead 410a of the lead frame by conductive wire ribbon 126a. Alternatively, as shown in FIG. 4B, wire 406 may directly form an electrical connection between lead 410a and the upper surface 130a of die 130 without an intervening trace (see package 408). In assembly 408, wire ribbon 126*b* still forms both a mechanical and electrical connection between die attach pad 122 and lead frame 410*b*.

Figure 5:
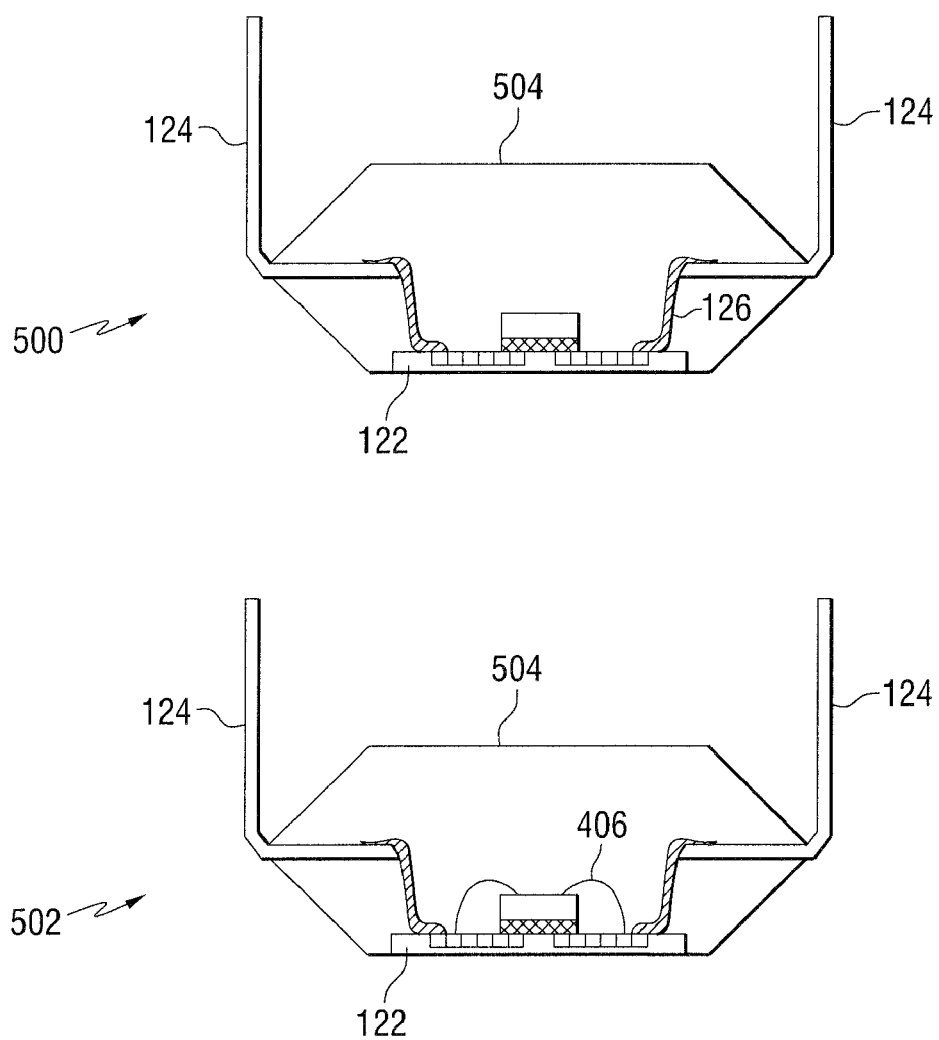
FIG. 5 shows a semiconductor package after the molding compound is disposed about the frame and pad.

FIG. 5 depicts two packages 500 and 502. After the die pad 122 and lead frame 124 have been connected with wire ribbon 126, molding 504 may be formed about the assembly. The tie bars (see tie bar 208 of FIG. 2B) may be cut and the external portions of the lead frame 124 bent into a configuration appropriate for the end use of the package. In package 500, the die is a flip-chip die and is connected to the traces of pad 122 by direct physical contact. In package 502, wires 406 connected the die to the traces of the pad 122 prior to the attachment of the lead frame.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed is:

1. A semiconductor package comprising
   a lead frame with a plurality of leads disposed in a first plane;
   a die attach pad with a plurality of conductive traces isolated from each other by insulating regions and disposed in a second plane spaced from the first plane;
   a semiconductor die mounted on the die attach pad and the conductive traces such that the die is in electrical communication with the plurality of said conductive traces;
   a plurality of wire ribbons extending from the leads of the lead frame to the respective conductive traces on the die attach pad for mechanically and electrically connecting the plurality of leads of the lead frame to the respective conductive traces of the die attach pad and wherein the wire ribbon has a first end section contacting a lead of the lead frame, a second end section contacting a conductive trace of the die attach pad, and an intermediate section between the two end sections and disposed substantially transverse to the two end sections such that the die attach pad is spaced from the lead frame by a gap.

2. The semiconductor package as recited in claim 1, wherein the wire ribbon comprises a metal selected from the group consisting of aluminum and copper.

3. The semiconductor package of claim 1, wherein the semiconductor die is a flip-chip die and the die is in electrical communication with the plurality of said conductive traces through a flip-chip die lead that is contiguous with at least one trace of said plurality of circuit traces.

4. The semiconductor package of claim 1, wherein the lead frame and the die attach pad are discrete components.

5. The semiconductor package of claim 1, further comprising a wire electrically connecting said die to at least one of said plurality of conductive traces.

6. The semiconductor package of claim 5, wherein said wire is a gold wire.

7. The semiconductor package of claim 1, further comprising a molded housing encapsulating the die attach pad, the die, the plurality of wire ribbons, and a part of the lead frame such that a portion of the lead frame remains external to the molded housing.

8. A semiconductor package comprising
   a lead frame with a plurality of leads;
   a die attach pad with a plurality of conductive traces isolated from each other by insulating regions, the lead frame and the die attach pad being discrete;
   a semiconductor die mounted on the die attach pad and the conductive traces such that the die is in electrical communication with the plurality of said conductive traces; and
   a plurality of wire ribbons extending from the leads of the lead frame to the respective conductive traces on the die attach pad for mechanically and electrically connecting the plurality of leads of the lead frame to the respective conductive traces of the die attach pad, and
   wherein the wire ribbon has a first end section contacting a lead of the lead frame, a second end section contacting a conductive trace of the die attach pad, and an intermediate section between the two end sections and disposed substantially transverse to the two end sections such that the die attach pad is spaced from the lead frame by a gap.

9. The semiconductor package as recited in claim 8, wherein the wire ribbon comprises a metal selected from the group consisting of aluminum and copper.

10. The semiconductor package of claim 8, wherein the semiconductor die is a flip-chip die and the die is in electrical communication with the plurality of said conductive traces through a flip-chip die lead that is contiguous with at least one conductive trace of said plurality of conductive traces.

11. The semiconductor package of claim 8, wherein the lead frame and the die attach pad are discrete components.

12. The semiconductor package of claim 8, further comprising a wire electrically connecting said die to at least one of said plurality of conductive traces.

13. The semiconductor package of claim 12, wherein said wire is a gold wire.

14. The semiconductor package of claim 8, further comprising a molded housing encapsulating the die attach pad, the die, the plurality of wire ribbons, and a part of the lead frame such that a portion of the lead frame remains external to the molded housing.

* * * * *